(12) United States Patent
Abela

(10) Patent No.: US 7,736,930 B2
(45) Date of Patent: Jun. 15, 2010

(54) OPTICAL DIE-DOWN QUAD FLAT NON-LEADED PACKAGE

(75) Inventor: Jonathan Abela, Thielle-Wavre (CH)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/353,489

(22) Filed: Jan. 14, 2009

(65) Prior Publication Data

US 2009/0162965 A1    Jun. 25, 2009

Related U.S. Application Data

(62) Division of application No. 11/381,827, filed on May 5, 2006, now Pat. No. 7,495,325.

(51) Int. Cl.
*H01L 21/00* (2006.01)
*H01L 21/44* (2006.01)

(52) U.S. Cl. .............................. 438/51; 438/22; 438/65; 438/116; 438/123; 257/E21.503

(58) Field of Classification Search ................... 438/51, 438/65, 22, 123; 257/E21.503, 666, 680
See application file for complete search history.

(56) References Cited

U.S. PATENT DOCUMENTS

| | | |
|---|---|---|
| 4,751,505 A | 6/1988 | Williams et al. |
| 5,369,550 A | 11/1994 | Kwon |
| 5,672,881 A | 9/1997 | Striepeke et al. |
| 6,114,752 A * | 9/2000 | Huang et al. ................. 257/666 |
| 6,147,389 A | 11/2000 | Stern et al. |
| 6,440,779 B1 * | 8/2002 | Chiu et al. ................... 438/123 |
| 6,518,656 B1 | 2/2003 | Nakayama et al. |
| 6,730,900 B2 | 5/2004 | Hsish et al. |
| 6,734,419 B1 | 5/2004 | Glenn et al. |
| 7,049,166 B2 * | 5/2006 | Salatino et al. ................ 438/64 |
| 7,138,661 B2 * | 11/2006 | Althaus et al. ................. 257/81 |
| 2002/0081780 A1 * | 6/2002 | Salatino et al. .............. 438/127 |
| 2002/0088632 A1 | 7/2002 | Salatino et al. |
| 2004/0042668 A1 | 3/2004 | Kaplinsky et al. |
| 2005/0056851 A1 * | 3/2005 | Althaus et al. ................. 257/81 |
| 2005/0258518 A1 | 11/2005 | Yang et al. |
| 2006/0016973 A1 | 1/2006 | Yang et al. |

* cited by examiner

*Primary Examiner*—Nitin Parekh
(74) *Attorney, Agent, or Firm*—Robert D. Atkins

(57) ABSTRACT

An optical sensor package that includes an optical sensor die is mounted by flip chip interconnect onto a lead frame in a "die-down" orientation, that is, with the active side of the optical sensor die facing the lead frame. An opening is provided in the lead frame die paddle (pad), and light passes from outside the package through the opening in the lead frame die pad onto light collection elements on the active side of the chip.

25 Claims, 5 Drawing Sheets

OPTICAL DIE-DOWN QUAD FLAT NON-LEADED PACKAGE

CLAIM OF DOMESTIC PRIORITY

The present application is a division of, claims priority to, and fully incorporates herein by reference U.S. patent application Ser. No. 11/381,827, filed May 5, 2006. This application further claims priority from U.S. Provisional Application No. 60/677,994, titled "Optical die down quad flat non-leaded package", filed May 5, 2005, which is hereby incorporated by reference herein.

BACKGROUND

This invention relates to image sensors and, particularly, to single-chip image sensor packaging.

The semiconductor sensor die employed in many digital cameras are wire bonded to the substrate or leadframe, so the die is oriented active face upward (in relation to the substrate or leadframe), with an opening to admit light in the molding overhead, or with a clear molding compound or a glass window in the molding overhead.

SUMMARY

Generally, the invention features an optical sensor package that includes an optical sensor die mounted by flip chip interconnect onto a lead frame in a "die-down" orientation, that is, with the active side of the optical sensor die facing the lead frame. An opening is provided in the lead frame die paddle (pad), and light passes from outside the package through the opening in the lead frame die pad onto light collection elements on the active side of the chip.

In one general aspect, the invention features an optical sensor semiconductor chip package, including: a lead frame having first and second sides and including a paddle and peripheral leads, and a die having an active side including a sensor area having an array of photosensor elements, and peripheral interconnect sites. The die is mounted onto the lead frame by flip chip interconnection; that is, the active side of the die faces the second side of the lead frame, and interconnect sites on the active side of the die are electrically connected to corresponding bond fingers on the second side of the leads by balls or bumps. An opening through the die paddle is situated such that the opening in the paddle and the sensor area are at least partly aligned. The opening in the paddle defines a paddle margin, and a seal is provided between the second side of the paddle margin and the active side of the die. The package is encapsulated, and the seal prevents the encapsulant from contaminating the sensor area of the die.

In some embodiments the die includes a charge coupled device (CCD) image sensor; in other embodiments the die includes a complementary metal oxide semiconductor (CMOS) image sensor. The image sensor can provide either a digital or an analog output. The image sensor can be either a color image sensor or a monochrome image sensor.

In some embodiments the interconnect employs a gold stud bump; in other embodiments the interconnect employs a solder bump.

In some embodiments the sensor area of the die is covered with a light-transmitting material. The light-transmitting material may transmit nearly all or only a part of light directed toward the die; for example, it may reduce the intensity of transmitted light in all or a portion of the spectrum, and it may specifically reduce the intensity of transmitted light in one or more selected portions of the spectrum. In some embodiments the opening through the paddle may be covered with a light-transmitting material, as a window.

In another general aspect the invention features a device including the optical sensor package; such devices include, for example, optical pointing devices (such as so-called "optical mouse"), cameras (such as so-called "web cam"), digital cameras (including video cameras and still cameras), and cameras that constitute part of a portable telecommunications device (camera in a mobile telephone for example), and the like.

In another general aspect the invention features a method for making an optical sensor semiconductor package.

The optical sensor package according to the invention has a thinner profile, owing to the flip-chip interconnection, with the active (sensing) side of the die facing the leadframe. A typical flip chip interconnect bump height, die-to-leadframe, is ~70 um. Where a lens is desired, the lens can be attached directly to the die pad, so the overall package thickness is less than for a die-up wire bond, where wire loop height and molding thickness contribute to package thickness. Also, the optical package according to the invention can be made inexpensively—less than for an equivalently functioning wire bonded optical package—because there are fewer assembly steps.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

The package can suitably be constructed as a die-down quad flat non-leaded package in which an opening is provided in the die pad of the lead frame, providing for passage of light from outside the package onto the active surface of the die. A seal is provided between the margin of the paddle, around the opening, to prevent encapsulant from contaminating the optical sensor area of the die.

Figure 1:
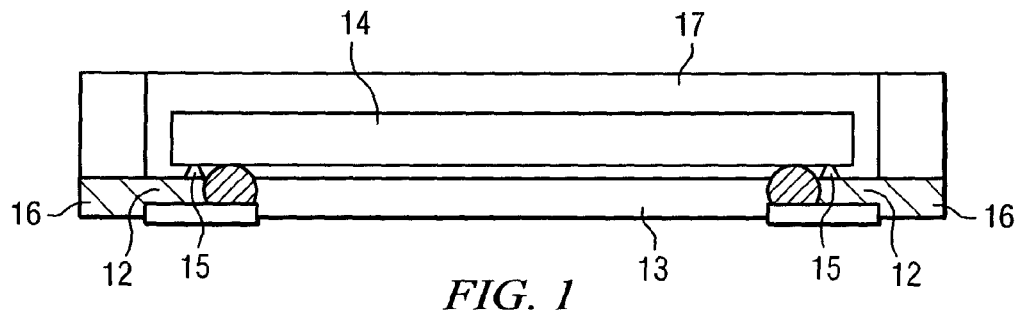
FIG. 1 is a sectional view, partly from a photomicrograph and partly sketched, showing a quad flat non-leaded package.
Figure 2:
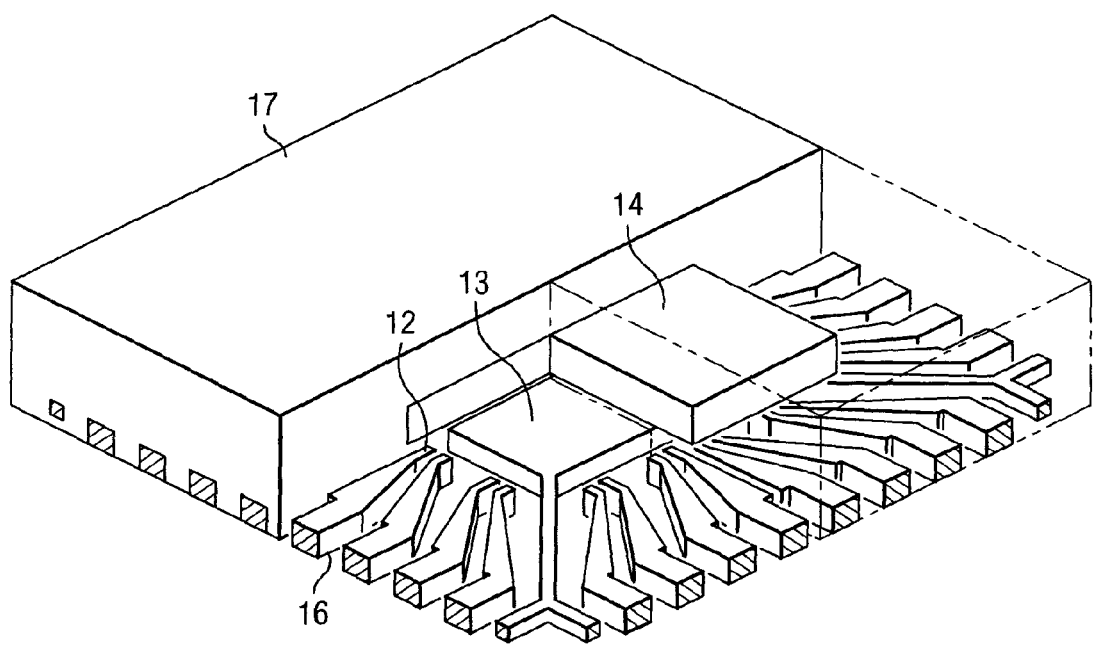
FIG. 2 is a diagrammatic partially cut away perspective view of a quad flat non-leaded package as in FIG. 1.

Turning now to FIGS. 1 and 2, there is shown a flip chip quad flat non-leaded package ("FC-QFN" package). The FC-QFN package includes a lead frame including a die pad 13 and leads 12, and a die 14 mounted on a die attach side of the lead frame by flip-chip interconnect 15. The lead frame may be made of copper, by for example masking and etching a copper sheet. The die, the interconnects and at least the die attach side of the lead frame are enclosed in an encapsulant 17. The QFN package is referred to as "non-leaded", because, rather than having extensions of the lead 12 beyond the encapsulation 17 for electrical connection of the package to, for example, a motherboard, connection of the QFN package is made by way of exposed portions 16 of the leads 12. The exposed portions 16 are substantially flush with the encapsulant on the leadframe side of the package. FC-QFN packages can be made highly compact (thin, with a small footprint in relation to the die size). A typical FC-QFN package may have a 5 mm×5 mm footprint, for a 3 mm×3 mm die. The package is thin, owing to the low profile of the flip-chip interconnect, which may include, for example, a gold bump on the die connected to a high-Pb bump on the leadframe.

According to the invention, an optical sensor is constructed using a QFN package substrate in which an opening has been provided in the die pad for passage of illumination onto the active side of the die. Referring now to FIGS. 3A, 3B, 3C and 3D, there is shown an embodiment of an optical sensor package according to the invention. The die 34 is mounted on the leads 32 by flip chip interconnection 35. An opening 31 (here circular) in the die pad 33 permits light to pass from outside the package onto the active side 39 of the die 34. A barrier 38, which may be an adhesive material, is compressed between the die pad 33 and the active side 39 of the die 34 to prevent flow of the encapsulant 37 onto the sensor portion of the active side of the die. The barrier may have the form of a ring, as shown by way of example by broken lines 38 in FIG. 3D or a rectangle (e.g., square), for example. Exposed surfaces 36 of the leads 32 provide for electrical connection of the package with, for example, a motherboard or other circuitry in the device in which the package is employed. An array of such packages are typically formed, beginning with a lead frame array, and then saw singulated following encapsulation to form individual packages. In conventional QFN processing, a coverlay is provided during processing on the side of the leadframe opposite the die attach side; typically the coverlay is removed following encapsulation. Here, the coverlay may be left in place to protect the active side of the die from contamination during processing, until the final test of the functionality of the sensor package.

The optical sensor package according to the invention may be made very thin, providing for a very short light path. Overall package thickness about 0.7 mm can be readily obtained, and reduction of thickness to 0.5 mm or less is possible.

Embodiments as in FIGS. 3A-3D can be useful particularly in low end applications such as an optical pointing device ("optical mouse", e.g.) or an optical data scanner or reader such as a DVD reader, in which imaging quality may acceptably be low. Alternatively, the active side of the die may be protected by a coating, as shown in FIGS. 5A, 5B; or, the die pad may be half-etched to provide a step in which a glass or plastic insert may be placed to protect the die from contamination and, further to provide some optical function, as described with reference to FIGS. 4B, 4C.

Figure 3A:
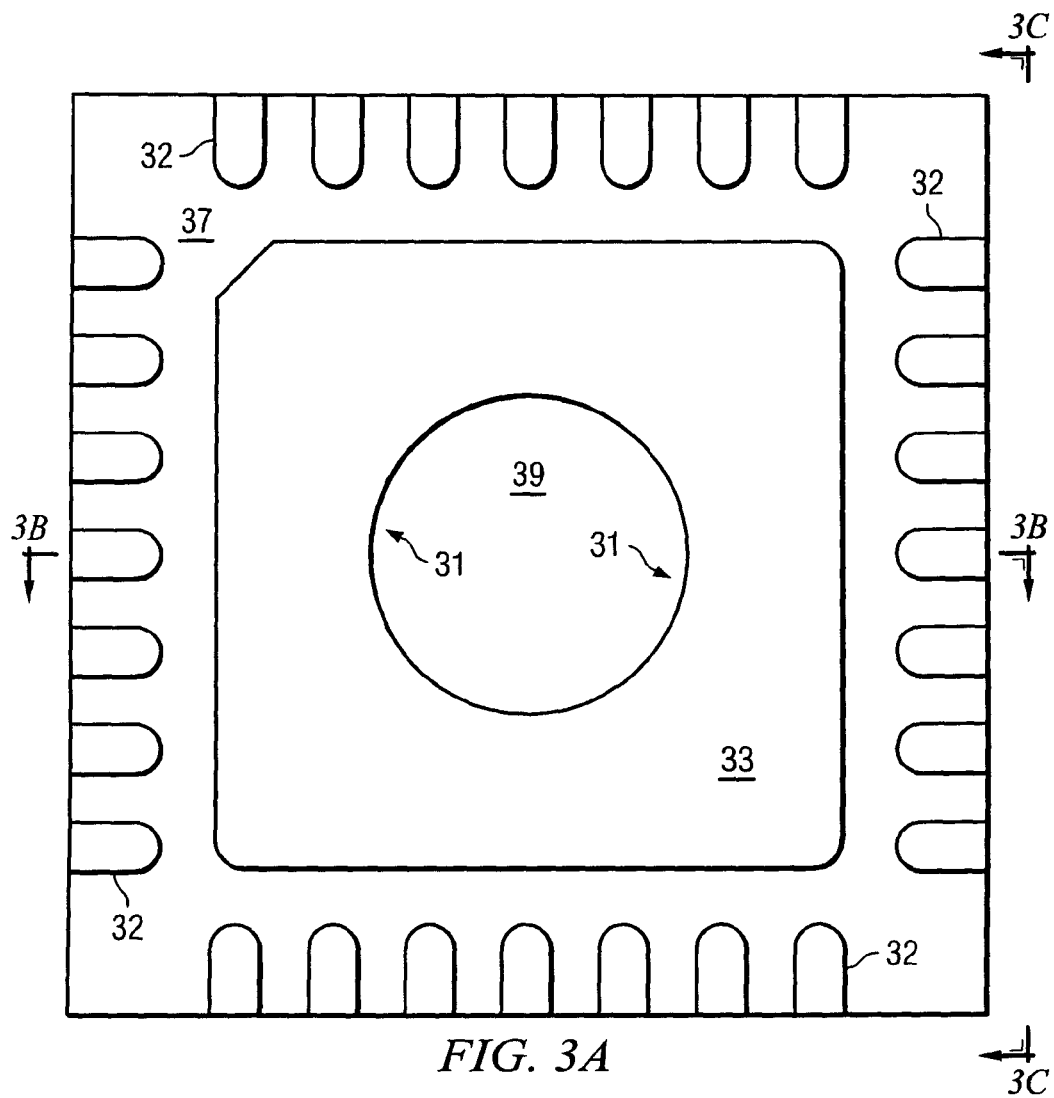
FIG. 3A is a sketch in a plan view showing the lead frame side of a package according to an embodiment of the invention.
Figure 3B:
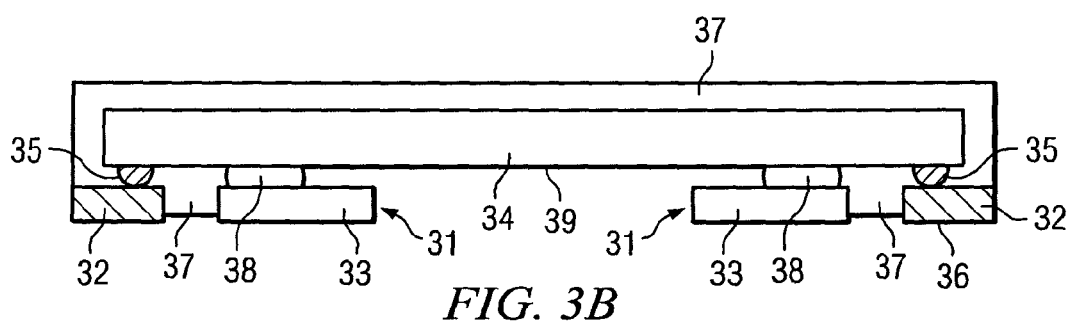
FIG. 3B is a sketch of a package as in FIG. 3A, in a sectional view thru B-B.
Figure 3C:
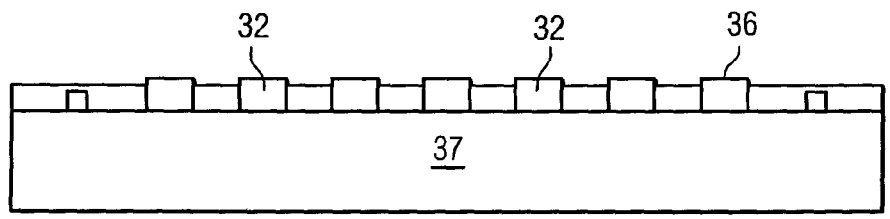
FIG. 3C is a sketch in an elevational view of a package as in FIG. 3A.
Figure 3D:
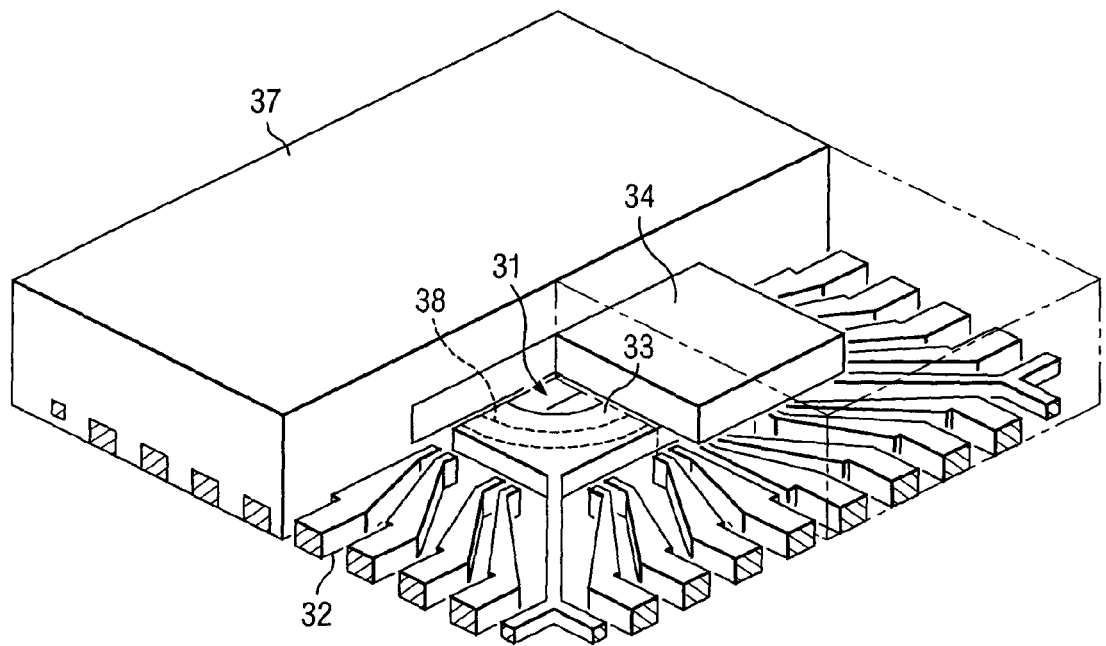
FIG. 3D is a diagrammatic partially cut away perspective view of a package according to the invention, as in FIG. 3A.
Figure 4A:
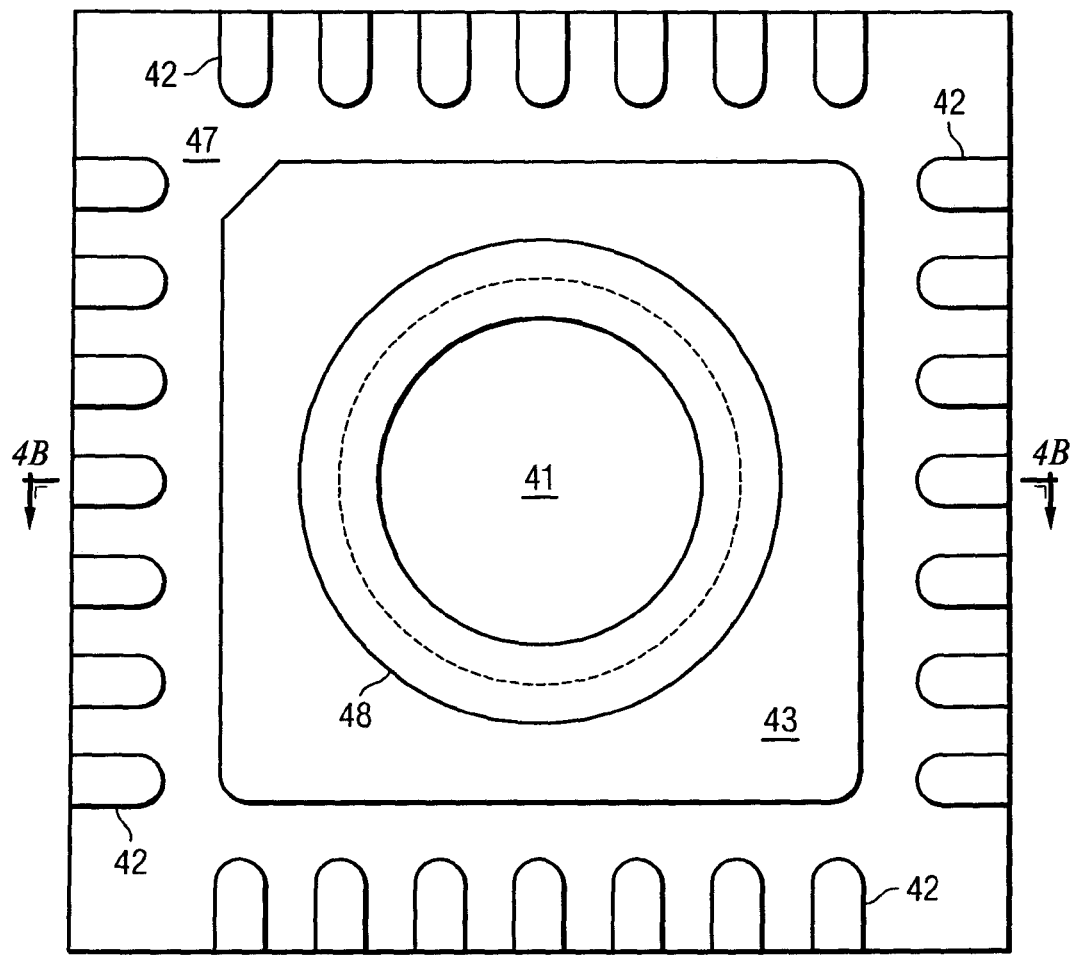
FIG. 4A is a sketch in a plan view showing the lead frame side of a package according to an embodiment of the invention.
Figure 4B:
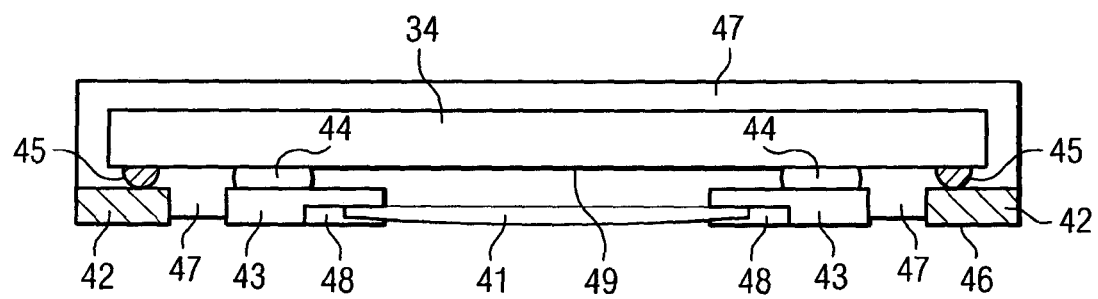
FIG. 4B is a sketch of a package as in FIG. 4A, in a sectional view thru B-B.
Figure 5A:
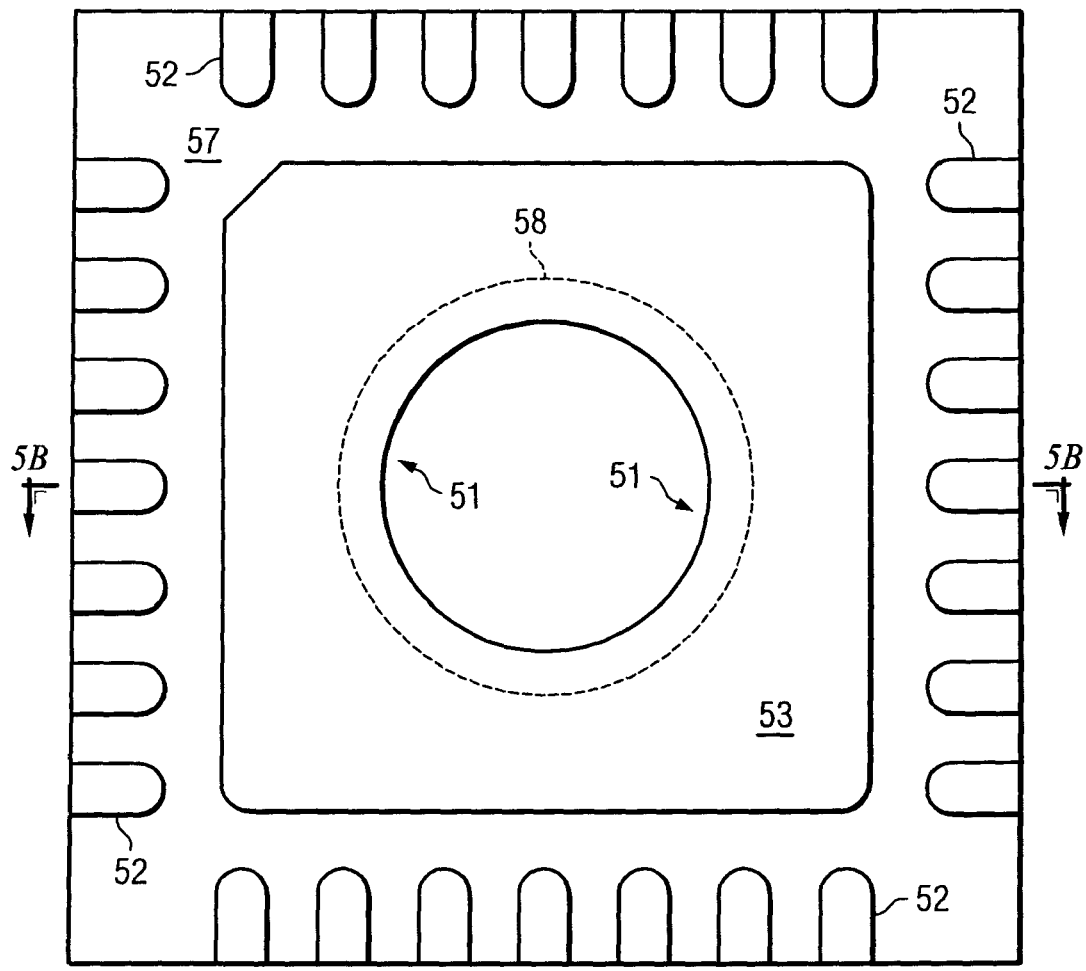
FIG. 5A is a sketch in a plan view showing the lead frame side of a package according to an embodiment of the invention.
Figure 5B:
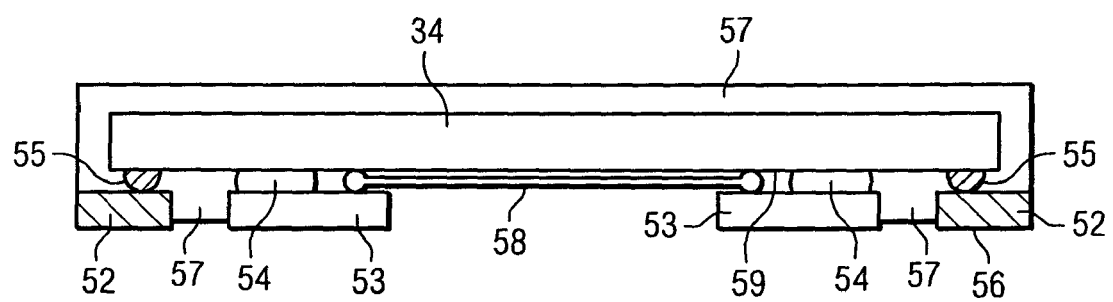
FIG. 5B is a sketch of a package as in FIG. 5A, in a sectional view thru B-B.

Referring now to FIGS. 4A and 4B, generally as in FIGS. 3A-3B, the die 34 is mounted on the leads 42 by flip chip interconnection 45. An opening (here circular) in the die pad 43 permits light to pass from outside the package onto the active side 49 of the die 34. A barrier 44, which may be an adhesive material, is compressed between the die pad 43 and the active side 49 of the die 34 to prevent flow of the encapsulant 47 onto the sensor portion of the active side of the die. The barrier may have the form of a ring or a rectangle (e.g., square), for example. Exposed surfaces 46 of the leads 42 provide for electrical connection of the package with, for example, a motherboard or other circuitry in the device in which the package is employed. In this embodiment, a portion of the die pad 43 adjacent the opening is half-etched to provide a step, in which a transparent cover 41 may be mounted and affixed using a sealant or adhesive 48. The cover may be, for example, made of glass or of plastic; and it may be translucent to a broad portion of the electromagnetic spectrum (such as, for example, the visible spectrum), or to selected portion(s) of the spectrum, depending upon the particular application. According to the particular application, the cover may be designed to provide little or no optical imaging effect; or, it may be shaped as a lens. And, according to the application, the material of the cover may be selected to provide substantially no filtration of the entering illumination or, alternatively, to provide selected broad-band or selected narrow-band filtration.

The cover may be applied either following singulation of the packages, or—to protect the die during processing—following singulation.

Embodiments as in FIGS. 4A and 4B can be useful particularly in applications where higher quality imaging is required, as for example in cell phone cameras (employing CCD or CMOS imaging technology).

Referring now to FIGS. 5A, 5B, a coating 58 may be provided over the active (sensor) side 59 of the die 34. The coating may be applied directly onto the die surface. Generally as in FIGS. 3A-3B, the die 34 is mounted on the leads 52 by flip chip interconnection 55. An opening (here circular) in the die pad 53 permits light to pass from outside the package onto the active side 59 of the die 34. A barrier 54, which may be an adhesive material, is compressed between the die pad 53 and the active side 59 of the die 34 to prevent flow of the encapsulant 57 onto the sensor portion of the active side of the die. The barrier may have the form of a ring or a rectangle (e.g., square), for example. Exposed surfaces 56 of the leads 52 provide for electrical connection of the package with, for example, a motherboard or other circuitry in the device in which the package is employed. The material of the coating may be selected according to the function of the sensor and its sensitivity, and may be selected to provide substantially no filtration of the entering illumination or, alternatively, to provide selected broad-band or selected narrow-band filtration.

Embodiments as in FIGS. 5A and 5B can be useful particularly in low end applications such as an optical pointing device ("optical mouse", e.g.) or an optical data scanner or reader such as a DVD reader, or in a so-called "web cam", in which imaging quality may acceptably be low.

Other embodiments are within the scope of the invention.

What is claimed is:

1. A method of making a low-profile optical sensor package, comprising:
   providing a leadframe having a die pad and interconnect leads electrically isolated from and surrounding the die pad, the die pad having an opening centrally located with respect to a surface area of the die pad;

mounting a semiconductor die to the die pad, the semiconductor die having an optically active surface facing the die pad and aligned to the opening;

disposing a barrier layer around the opening and connecting the semiconductor die and die pad;

disposing an encapsulant over a portion of the semiconductor die and the leadframe, wherein the barrier layer isolates the encapsulant from the optically active surface of the semiconductor die; and mounting a light-transmitting cover across the opening in the die pad;

wherein the low-profile optical sensor package has a thickness of less than 0.7 millimeters.

2. The method of claim 1, wherein the barrier layer includes an adhesive material.

3. The method of claim 1, wherein the opening is circular or rectangular.

4. The method of claim 1, wherein the optically active surface includes a charge-coupled image sensor.

5. The method of claim 1, wherein the optically active surface includes a monochrome image sensor.

6. The method of claim 1, wherein the light-transmitting cover reduces the intensity of light transmitted through the opening to the optically active surface of the semiconductor die.

7. The method of claim 1, wherein the low-profile optical sensor package is a quad flat non-leaded package.

8. A method of making a semiconductor package, comprising:

providing a leadframe having a die pad and interconnect leads electrically isolated from the die pad;

mounting a semiconductor die to the die pad, the semiconductor die having an optically active surface facing the die pad and aligned to a centrally located opening in the die pad;

disposing a barrier layer around the centrally located opening and connecting the semiconductor die and die pad;

disposing an encapsulant over a portion of the semiconductor die and the leadframe, wherein the barrier layer isolates the encapsulant from the optically active surface of the semiconductor die; and mounting a light-transmitting cover across the centrally located opening in the die pad by etching the die pad to retain the light-transmitting cover.

9. The method of claim 8, wherein the semiconductor package has a thickness of less than 0.7 millimeters.

10. The method of claim 8, wherein the barrier layer includes an adhesive material.

11. The method of claim 8, wherein the centrally located opening is circular or rectangular.

12. The method of claim 8, wherein the optically active surface includes a charge-coupled image sensor.

13. The method of claim 8, wherein the light-transmitting cover reduces the intensity of light transmitted through the centrally located opening to the optically active surface of the semiconductor die.

14. The method of claim 8, wherein the semiconductor package is a quad flat nonleaded package.

15. A method of making an optical semiconductor package, comprising:

providing a leadframe having a die pad and interconnect leads electrically isolated from the die pad;

mounting a semiconductor die to the die pad, the semiconductor die having an optically active surface facing the die pad and aligned to an opening in the die pad;

disposing a barrier layer around the opening and connecting the semiconductor die and die pad;

disposing an encapsulant over a portion of the semiconductor die and the leadframe, wherein the barrier layer isolates the encapsulant from the optically active surface of the semiconductor die; and mounting a light-transmitting cover across the opening in the die pad by etching the die pad to retain the light transmitting cover.

16. The method of claim 15, wherein the semiconductor package has a thickness of less than 0.7 millimeters.

17. The method of claim 15, wherein the barrier layer includes an adhesive material.

18. The method of claim 15, wherein the optically active surface includes a charge-coupled image sensor.

19. The method of claim 15, wherein the optical semiconductor package is a quad flat nonleaded package.

20. A method of making an optical semiconductor package, comprising:

providing a leadframe having a die pad and interconnect leads electrically isolated from the die pad;

mounting a semiconductor die to the die pad, the semiconductor die having an optically active surface facing the die pad and aligned to an opening in the die pad;

disposing a barrier layer around the opening and connecting the semiconductor die and die pad; and disposing an encapsulant over a portion of the semiconductor die and the leadframe, wherein the barrier layer isolates the encapsulant from the optically active surface of the semiconductor die.

21. The method of claim 20, further including mounting a light-transmitting cover across the opening in the die pad.

22. The method of claim 21, further including etching the die pad to retain the light-transmitting cover.

23. The method of claim 21, wherein the light-transmitting cover reduces the intensity of light transmitted through the opening to the optically active surface of the semiconductor die.

24. The method of claim 20, wherein the semiconductor package has a thickness of less than 0.7 millimeters.

25. The method of claim 20, wherein the semiconductor package is a quad flat nonleaded package.

* * * * *